(12) United States Patent
Pan

(10) Patent No.: US 6,344,368 B1
(45) Date of Patent: Feb. 5, 2002

(54) METHOD FOR FORMING CMOS SENSOR

(75) Inventor: Jui-Hsiang Pan, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/603,628

(22) Filed: Jun. 26, 2000

(51) Int. Cl.[7] .............................................. H01L 21/00
(52) U.S. Cl. ............................ 438/57; 438/48; 438/59; 438/91; 438/141; 438/232; 438/237; 438/328
(58) Field of Search ............................ 438/57, 59, 48, 438/232, 237, 141, 328, 91

(56) References Cited

U.S. PATENT DOCUMENTS 6,066,510 A * 5/2000 Merril ........................... 438/27
6,096,573 A * 8/2000 Chen ............................ 438/48
6,100,466 A * 8/2000 Nishimoto .................. 136/258
6,150,189 A * 11/2000 Pan ............................. 438/59
6,194,260 B1 * 2/2001 Chien et al. ................. 438/232

* cited by examiner

Primary Examiner—Richard Elms
Assistant Examiner—Pho Luu

(57) ABSTRACT

The present invention is related to a method for forming a CMOS image sensor device. A CMOS image device has a first MOS device acting as a source follower of an active pixel, a second MOS device acting as a row select of the active pixel. An amorphous silicon layer acts as a photodiode area for collecting incident light over the first MOS device and the second MOS device. The amorphous silicon layer has both N-type and P-type dopants.

26 Claims, 12 Drawing Sheets

METHOD FOR FORMING CMOS SENSOR

BACKGROUND OF THE INVENTION

1. Field of the Invention

The present invention generally relates to a CMOS image device, and more particularly to an image sensor device with photo-diode on CMOS transistors.

2. Description of the Prior Art

Semiconductor image sensors are categorized into two kinds: CMOS sensor and charged-coupled device (CCD). Traditionally, CCD-based image devices are relatively expensive and have high power dissipation levels; thus, there is much interest in building single chip image device using standard CMOS process, which would promote integration and low power consumption.

A general photocell, that can be used in an active pixel sensor array, consists of a photodiode acting as a light sensor, a reset MOS acting as resetting a storage node and the photodiode potential, a source follower MOS and a row select MOS.

FIG. 1A is a cross sectional view showing a structure of a CMOS image sensor according to the prior art. A general photocell, that can be used in an active pixel sensor array, consists of a photodiode acting as a light sensor, a reset MOS device acting as resetting a storage node and the photodiode potential, a source follower MOS device and a row select MOS device. An epitaxial layer 110 is on a semiconductor substrate 100. The P-well 210 is in the semiconductor substrate 100. A reset MOS device comprises a first source terminal 240, a first drain terminal 520 and a first gate substrate 300 in and on a P-well 210. The first drain terminal 520 acts as an area collecting incident light. A source follower MOS device is adjacent to a row select MOS device. The source follower MOS device comprises a second source 260 and a second gate structure 310 in and on the P-well 210. The row select MOS device comprises a third gate 320 and a third drain terminal 280 on and in the P-well 210. A drain/source region 270 comprises a drain terminal of the source follower MOS device and a source terminal of the row select MOS device.

A first isolation device 430 is between the first drain terminal 520 of the reset MOS device and the second source terminal 260 of the source follower MOS device. And a second isolation device 440 is between the third drain terminal 280 of the row select MOS device and Eoutside device. A dielectric layer 410 covers all surfaces of the semiconductor substrate 100 and all MOS devices except the portions of the first drain terminal 520 and the second gate structure 310. The conductor 730 covers the portion surface of the semiconductor substrate 100 and electrically contacts the first drain terminal 520 and the second gate structure 310.

FIG. 1B is a top view showing a layout of a unit pixel of a CMOS image sensor according to the prior art. A first region 500 represents the reset MOS device. A second region 330 represents the source follower MOS device and a third region 700 is the row select MOS device. A fourth region 900 is the conductor connecting the source follower 330. A discharged voltage Vdd connects a fifth region 400. A dielectric region 410 covers all surfaces of the CMOS image sensor.

FIG. 1C depicts a generic realization of a photocell that can be used in an active pixel array in the prior art. Initially, a positive reset signal is applied to a gate of a reset MOS 500, which turns on as a result and resets the voltage across the photodiode to some preset value near the discharged voltage. The measurement of light energy is accomplished by turning off the reset MOS 500 and letting the voltage change across the photodiode discharge in response to the light energy failing on it. The actual signal due to the amount of illumination falling on the photodiode during the integration period is the difference between the voltage measured at the end of the integration period and the output voltage obtained after turning on the reset MOS 500 to reset the photodiode voltage to the preset value. After a predetermined integration time the voltage level across the photodiode is amplified by a source follower MOS 330 and sampled at an output node 800 of row select MOS 700.

Moreover, the prior photocell is formed by building the photodiode and three MOSs on a horizontal level area without arrangement of up-and-down overlap, and all source and drain regions in the P-well results in large consumption of dimensions. Furthermore, the photodiode resetting potential in the prior photocell is not more than the discharged voltage and restricts the quantum efficiency of photodiode.

SUMMARY OF THE INVENTION

In accordance with the present invention, a CMOS image device comprised a photocell and two transistors.

It is further object of this invention that a structure of amorphous silicon is used as the area of a photocell for collecting incident light.

It is another object of this invention that a CMOS image sensor is arranged in a modified area that can both reduce the pixel size and maintain sensitivity of the image sensor.

In the present invention, a CMOS image device has a semiconductor substrate of a first conductivity whereon comprises an epitaxial layer formed. A first MOS device is formed by any suitable methods and has a source terminal connected to a supply voltage, a drain terminal, and a gate structure in and on the semiconductor substrate. Similarly, a second MOS device is formed by any suitable methods, and has a source terminal, a drain terminal connected to an output device and a gate structure in and on the semiconductor substrate. The source terminal of the second MOS device is adjacent to the drain terminal of the first MOS device. The first MOS device acts as a source follower of an active pixel and the second MOS device as a row select. A first dielectric layer such as an nitride layer covers all the upper surfaces of the first MOS device, the second MOS device and the semiconductor substrate except the portion of the surface of the gate structure of the first MOS device. A polysilicon layer of N-type is formed on the first dielectric layer, and electrically contacts the gate structure of the first MOS device. Then, a key structure in this invention is to form an amorphous silicon layer on the polysilicon layer by any suitable methods. The amorphous silicon layer is blanket ion-implanted with dopants of a second conductivity opposite to the first conductivity therein near the surface of the polysilicon layer, while dopants of the first conductivity therein near the upper surface thereof. The amorphous layer acts as an area of a photo-diode for collecting incident light, which is over the first MOS device and the second MOS device. Furthermore, an electric node is formed on the amorphous silicon layer by any suitable methods and a second dielectric layer such as an oxide layer covers the amorphous silicon layer and the electric node. A via plug structure connecting a bias or ground outside is in a via hole through the second dielectric layer and electrically connects the electric node. A contact plug structure is in a contact window through the second dielectric layer, the amorphous silicon layer, the polysilicon layer and the first dielectric layer. The contact plug structure electrically connects the gate structure of the second MOS device. Besides, the CMOS image device further comprises a first well and a second well of the second conductivity in the semiconductor substrate, and the all MOS devices between the first well and the second well. A first diffusion region is both in the first well and under the surface of the semiconductor substrate and contacts electrically the polysilicon layer. A second diffusion region is both in the second well and under the surface of the semiconductor substrate and contacts electrically the polysilicon layer. Then a first isolation device is between the first diffusion region and the first source terminal. A second isolation device is between the diffusion region and the second drain terminal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
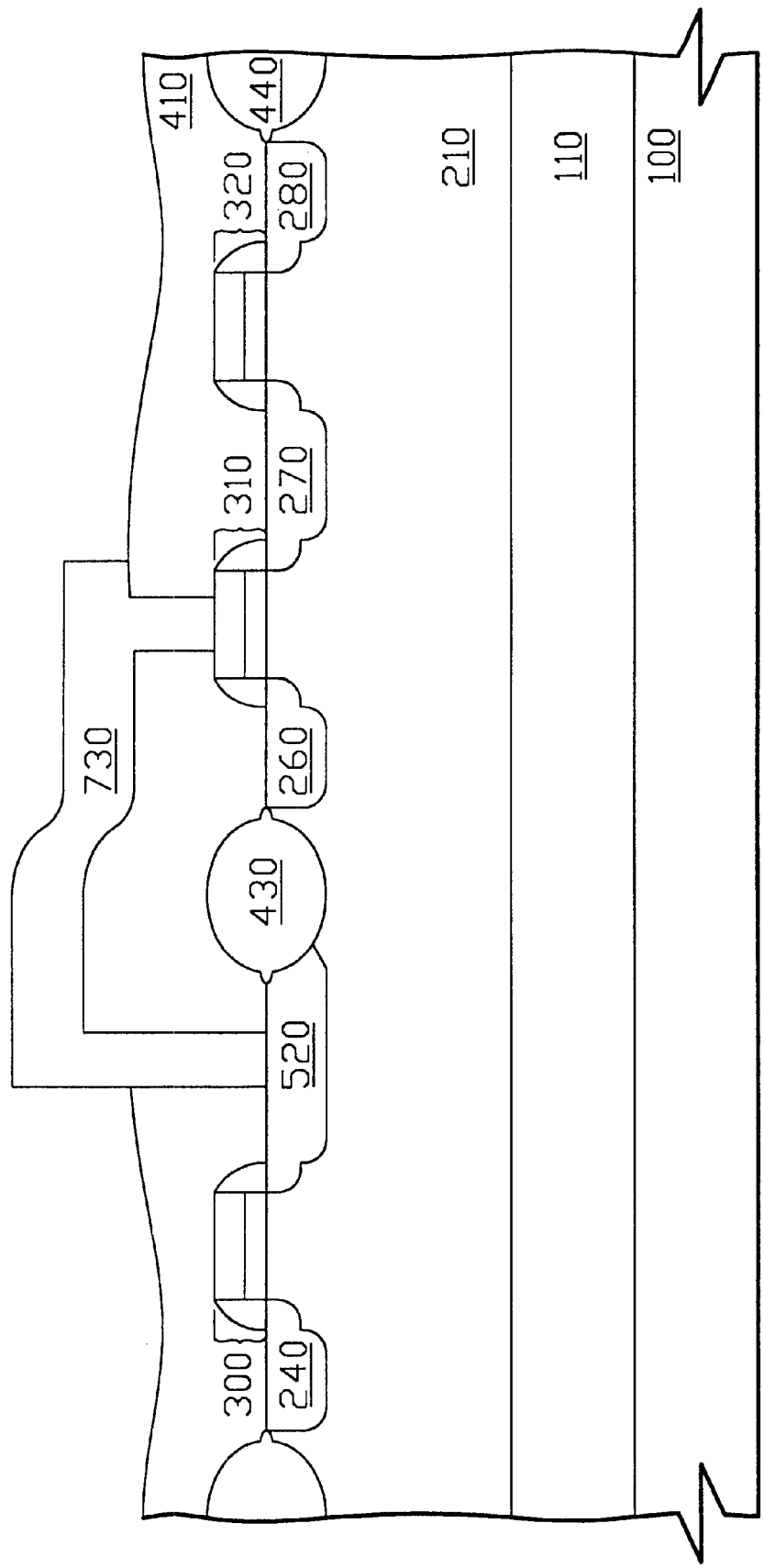
FIG. 1A is a cross sectional view showing a structure of a CMOS image sensor according to the prior art.
Figure 1B:
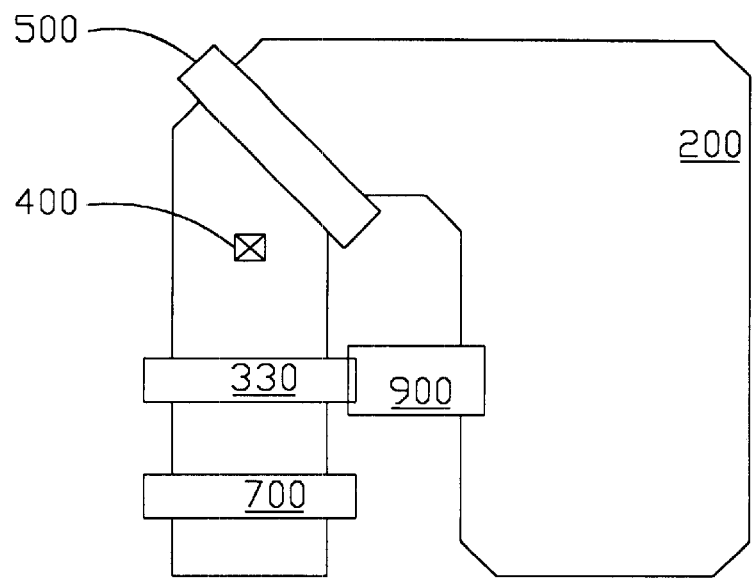
FIG. 1B is a top view showing a layout of a unit pixel of a CMOS image sensor according to the prior art.
Figure 1C:
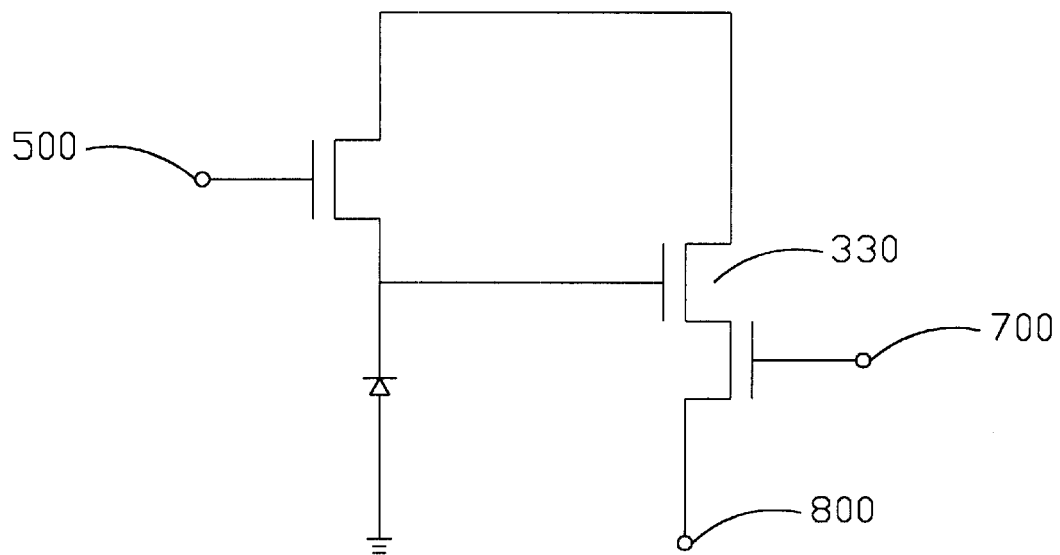
FIG. 1C depicts a generic realization of a photocell that can be used in an active pixel sensor array in the prior art.

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered and that species and types of substrate and dopant as well as other materials substitutions can be freely made without departing from the spirit and scope of the invention.

Furthermore, the invention allows ease of use and compatibility with bulk CMOS, and it has advantages over SOI in material quality. While the present invention is illustrated herein with CMOS, it is to be understood that the present invention is also applicable to high-performance logic, stand-alone SRAMs, and BiCMOS devices.

Furthermore, there is shown a representative portion of a semiconductor structure of the present invention in enlarged, cross-sections of two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a CMOS image device has a P-type semiconductor substrate whereon comprises an epitaxial layer formed. A P-well and a first N-well and a second N-well are formed in the semiconductor substrate. The P-well is between the first N-well and the second N-well. A first NMOS device is formed by any suitable methods and has a source terminal connected to a supply voltage, a drain terminal, and a gate structure in and on the semiconductor substrate. Similarly, a second NMOS device is formed by any suitable methods, and has a source terminal, a drain terminal connected to an output device and a gate structure in and on the semiconductor substrate. The source terminal of the second MOS device is adjacent to the drain terminal of the first MOS device. The first MOS device acts as a source follower of an active pixel and the second MOS device as a row select. An N-type first diffusion region, which is connected to another supply voltage and has a heavier dopants than the first N-well does, is formed by any suitable ion-implantation and on the surface of the semiconductor substrate and in the first N-well. An N-type second diffusion region, which has a heavier dopants than the second N-well does, is formed by any suitable ion-implantation and on the surface of the semiconductor substrate and in the second N-well. A first isolation device contacts the N-type first diffusion region and the source terminal of the first NMOS device, and is on the upper surface between the P-well and the first N-well. A second isolation device contacts with the second diffusion region and the drain terminal of the second NMOS device, and is on the upper surface between the P-well and the second N-well. An nitride layer covers all the upper surfaces of the first NMOS device, the second NMOS device and the semiconductor substrate except the portion of the surface of the gate structure of the first NMOS device. A polysilicon layer of N-type is formed on the nitride layer, and electrically contacts the gate structure of the first NMOS device. Then, a key structure in this invention is to form an amorphous silicon layer on the polysilicon layer by any suitable methods. The amorphous silicon layer is blanket ion-implanted with dopants such as arsenic therein near the surface of the polysilicon layer, while dopants such as boron fluoride in the amorphous layer near the upper surface thereof. The amorphous layer acts as an area of a photodiode for collecting incident light, which is over the first MOS device and the second MOS device. Next, an electric node is formed on the amorphous silicon layer by any suitable methods and an oxide layer covers the amorphous silicon layer and the electric node. A via plug structure connecting a bias or ground outside is in a via hole through the oxide layer and electrically connects the electric node. A contact plug structure is in a contact window through the oxide layer, the amorphous silicon layer, the polysilicon layer and the nitride layer. The contact plug structure electrically connects the gate structure of the second MOS device.

Figure 2A:
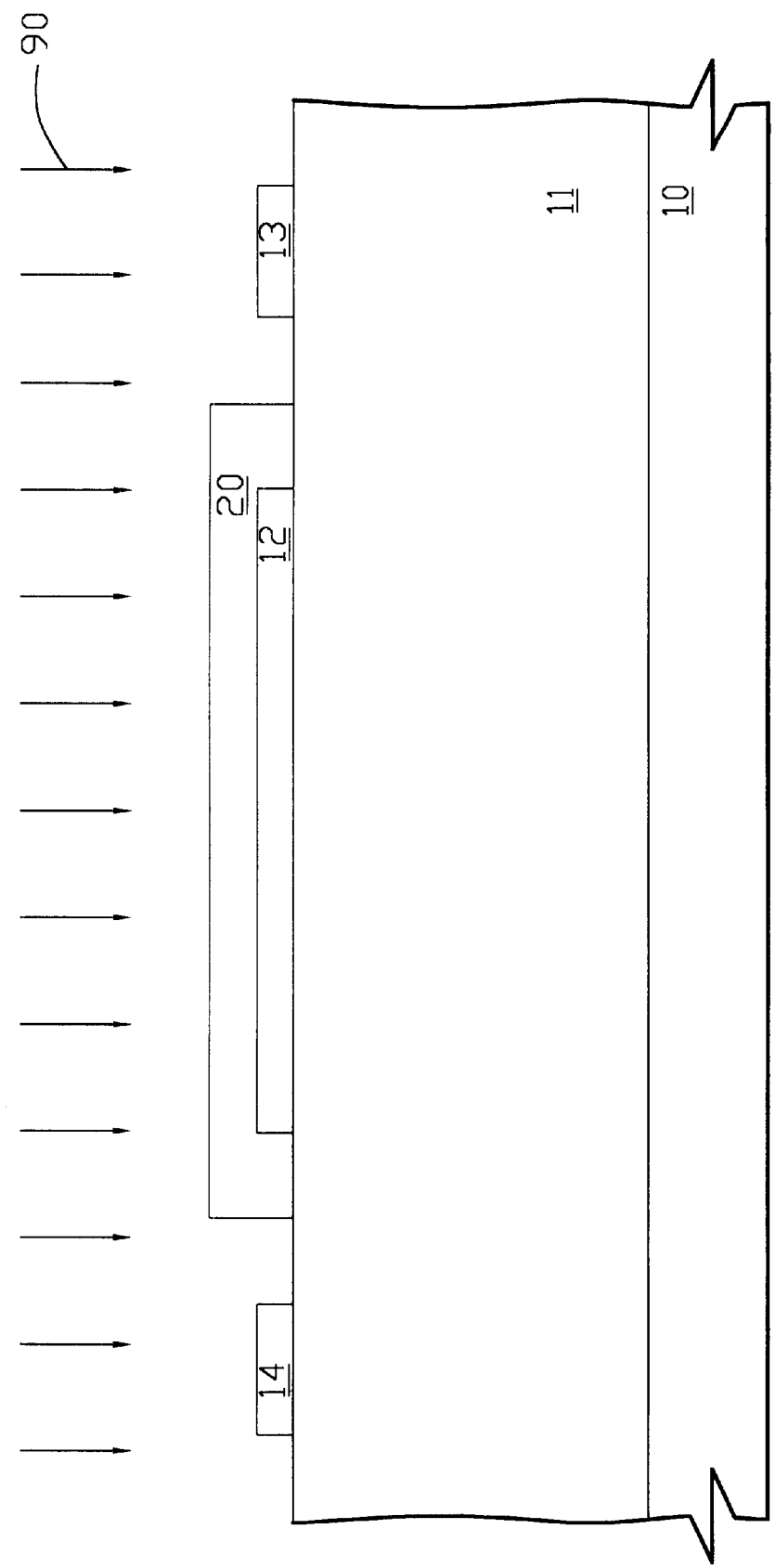
FIGS. 2A–2I are the cross sectional views showing a structure of the CMOS image sensor in fabrication according to the invention.

In a preferred embodiment, a semiconductor substrate 10 is provided having a heavily P type dopant. A P-type epitaxial layer 11 ("P-epi"), having less defects than conventional silicon, is deposited on the upper surface of the substrate 10 by any conventional vapor phase epitaxial techniques. A plurality of active regions patterned define an active pixel region by a first barrier 12, a first outside region by a second barrier 14 and a second outside region by a third barrier 13. Each said barrier comprises a pad oxide layer and an nitride layer. A P-type dopants 90 for forming a P-well (not shown) are ion-implanted in the portion of the P-epitaxial layer 11 patterned by a first photoresist mask 20, as shown in FIG. 2A.

Figure 2B:
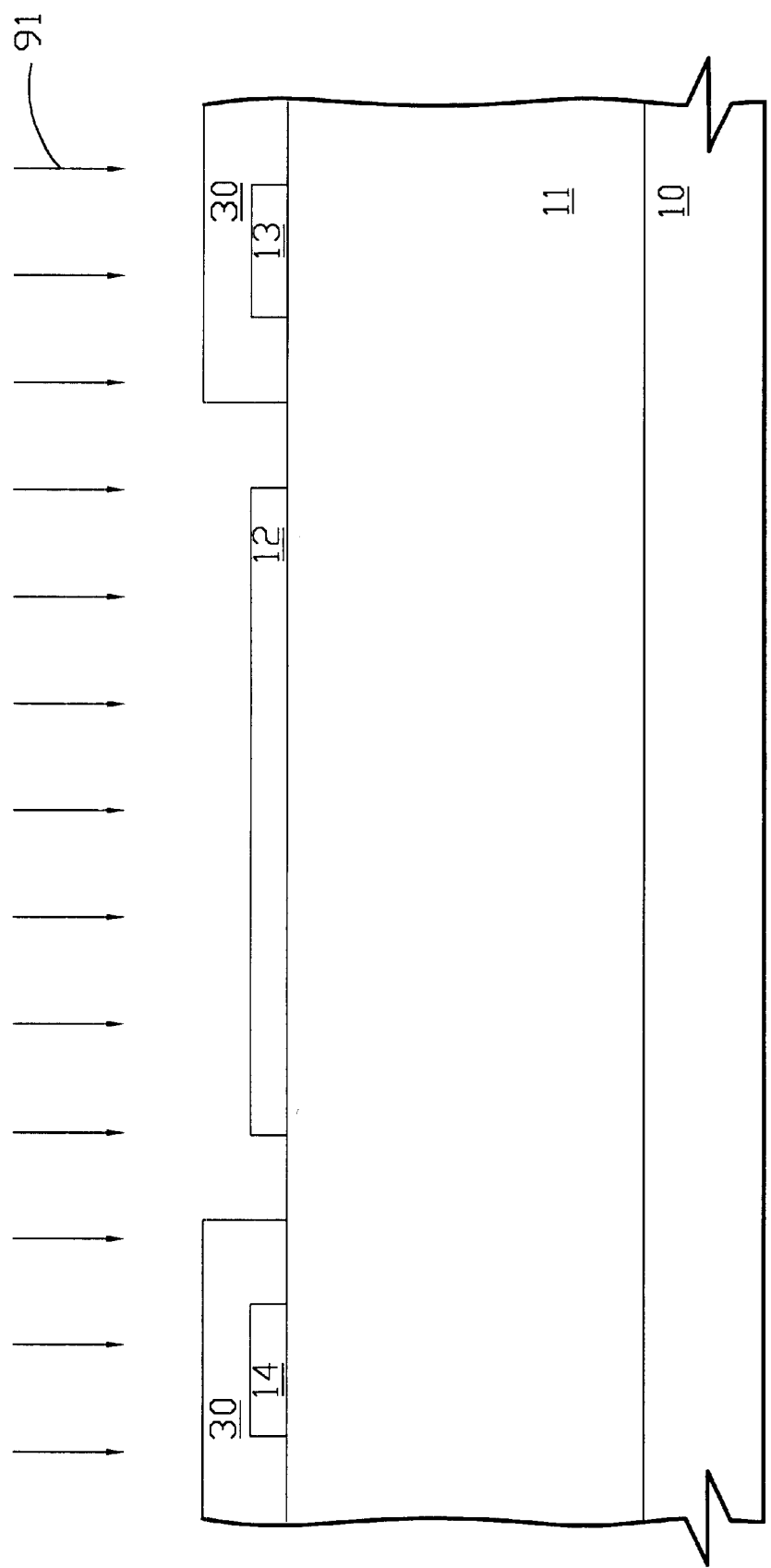

The first photoresist mask 20 is then removed by any suitable methods. An N-type dopants 91 for forming a plurality of N-wells (not shown) are ion-implanted in the portion of the P-epitaxial layer 11 patterned by a second photoresist mask 30 as depicted in FIG. 2B.

Figure 2C:
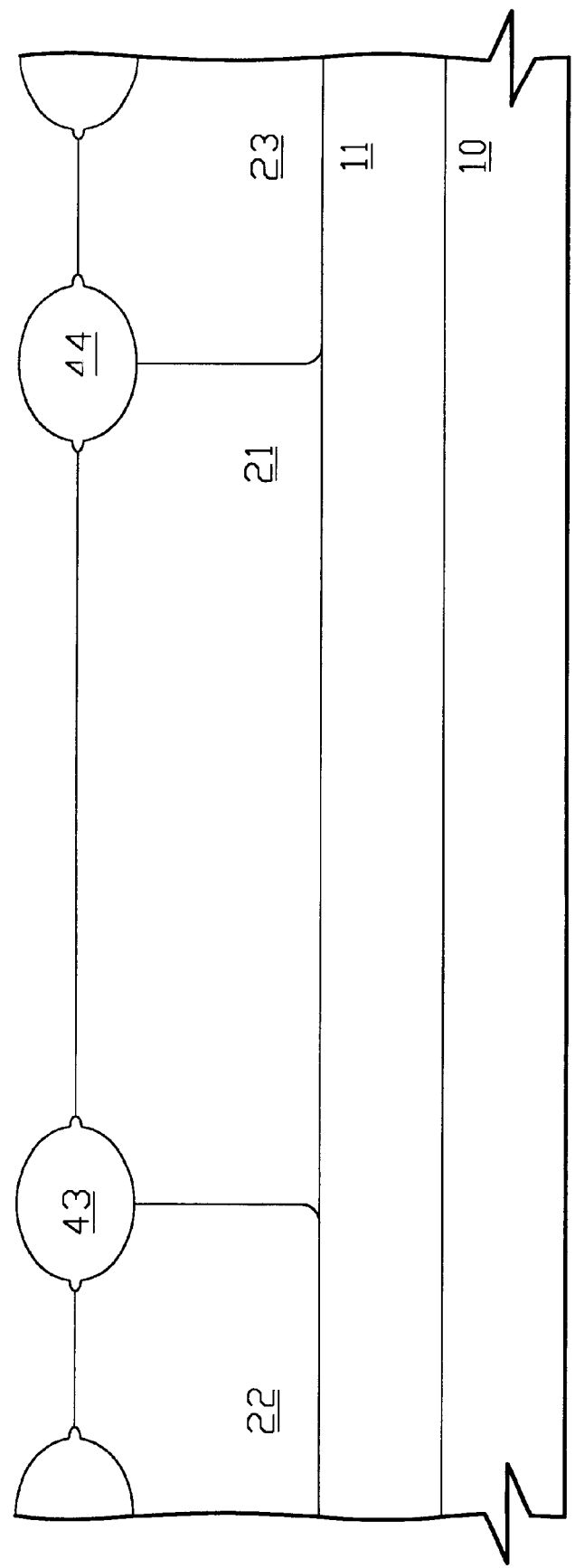

Next, after the second photoresist mask 30 is removed by any suitable methods, the wafer is placed into furnace and the implanted ions will drive in the P-epitaxial layer 12 by high temperature diffusion. A P-well 21, a first N-well 22 and a second N-well 23 are formed in the P-epitaxial layer and profiled by this drive-in method mentioned above. The P-well 21 is between the first N-well 22 and the second N-well 22. Then, a first isolation device 43 and a second isolation device 44 are formed on the upper surface of the P-epitaxial layer 11 by any conventional thermal oxidation such as local oxidation of silicon (LOCOS). The amounts of isolation device depend on the layout rule and line width. The first isolation device 43 is on the upper surface between the P-well 21 and the first N-well 22. The second isolation device 44 is on the upper surface between the P-well 21 and the second N-well 23. All the barriers are thereafter removed by any conventional method such as cleaning by hot phosphoric acid solution, as shown in FIG. 2C.

Figure 2D:
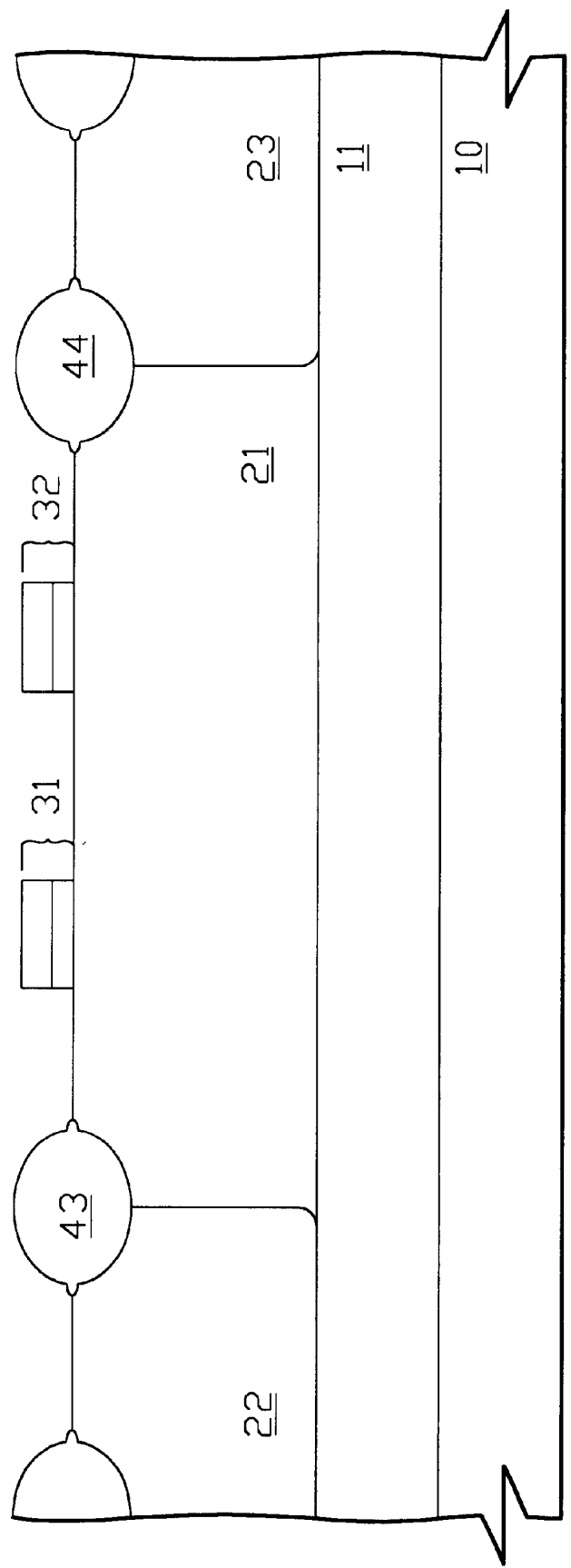

A gate oxide layer is firstly formed on the upper surface of the P-epitaxial layer 11 by any conventional thermal oxidation, and thereafter a polysilicon layer is deposited on the gate oxide layer by low pressure chemical vapor deposition (LPCVD). Then a first gate structure 31 and a second gate structure 32 are patterned and formed on the upper surface of the P-well 21. Each gate structure comprises a gate oxide layer and a polysilicon layer as depicted in FIG. 2D.

Figure 2E:
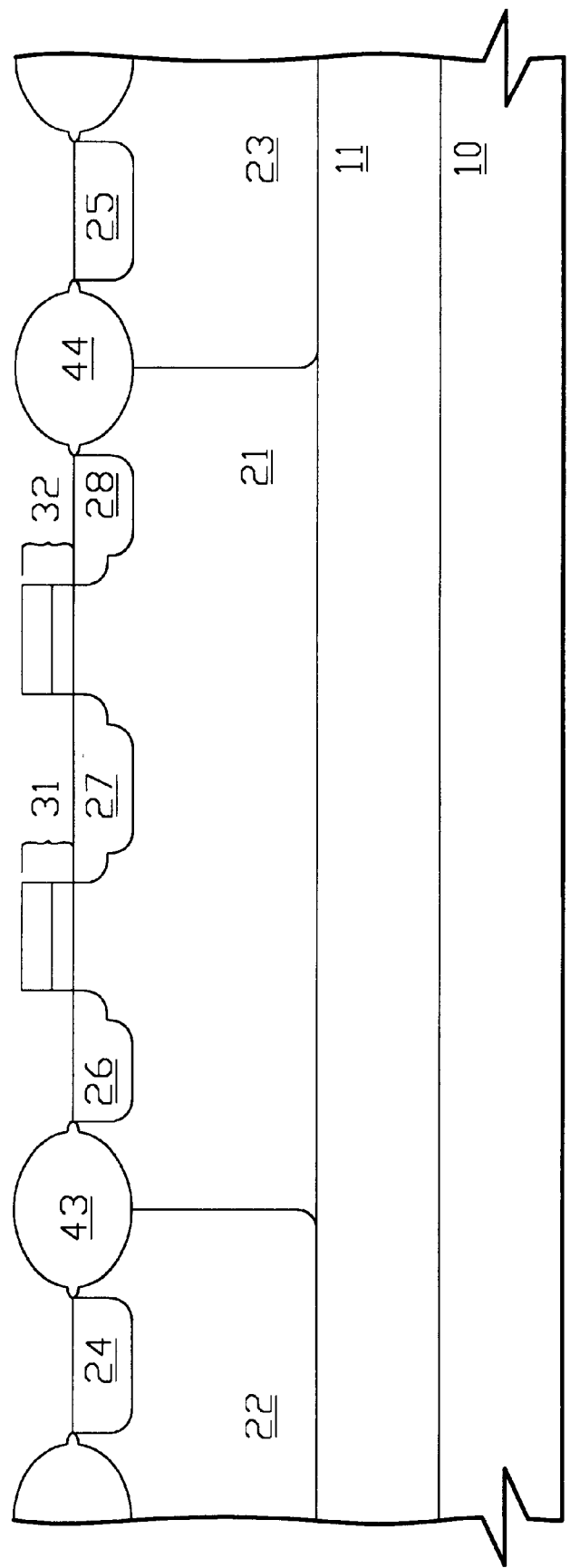

As shown in FIG. 2E, an N-type dopants are ion-implanted in the P-well 21, the first N-well 22 and the second N-well 23 by any suitable methods.

An N-type first diffusion 24, which has a heavier dosage than the first N-well 22 has, is formed on the surface of the P-epitaxial layer 11 and in the first N-well 22. Besides, the N-type first diffusion 24 is connected to supply voltage Vdd1 (not shown). An N-type second diffusion 25, which also has a heavier dosage than the second N-well 23 has, is formed on the surface of the P-epitaxial layer 11 and in the second N-well 23.

A first source terminal 26, which is connected to another supply voltage Vdd2 (not shown), is formed in the P-well 21 and between the first isolation device 43 and the first gate structure 31. A drain/source region 27, which comprises a first drain terminal adjacent to a second source terminal, is formed in the P-well 21 and between the first gate structure 31 and the second gate structure 32. A second drain terminal 28, which is connected to an output device, is formed in the P-well 21 and between the second gate structure 32 and the second isolation device 44. The first source terminal 26, the drain/source region 27 and the second drain terminal 28 further have a plurality of lightly doped drain regions adjacent thereto.

A first NMOS device, wherein has the first source terminal 26 and the first gate structure 31 and the drain terminal (the portion of the drain/source region 27), acts as a source follower of an active pixel. A second NMOS device, which has the second source terminal (the portion of the drain/source region 27) and the second gate structure 32 and the second drain terminal 28, acts as a row select of the active pixel.

Figure 2F:
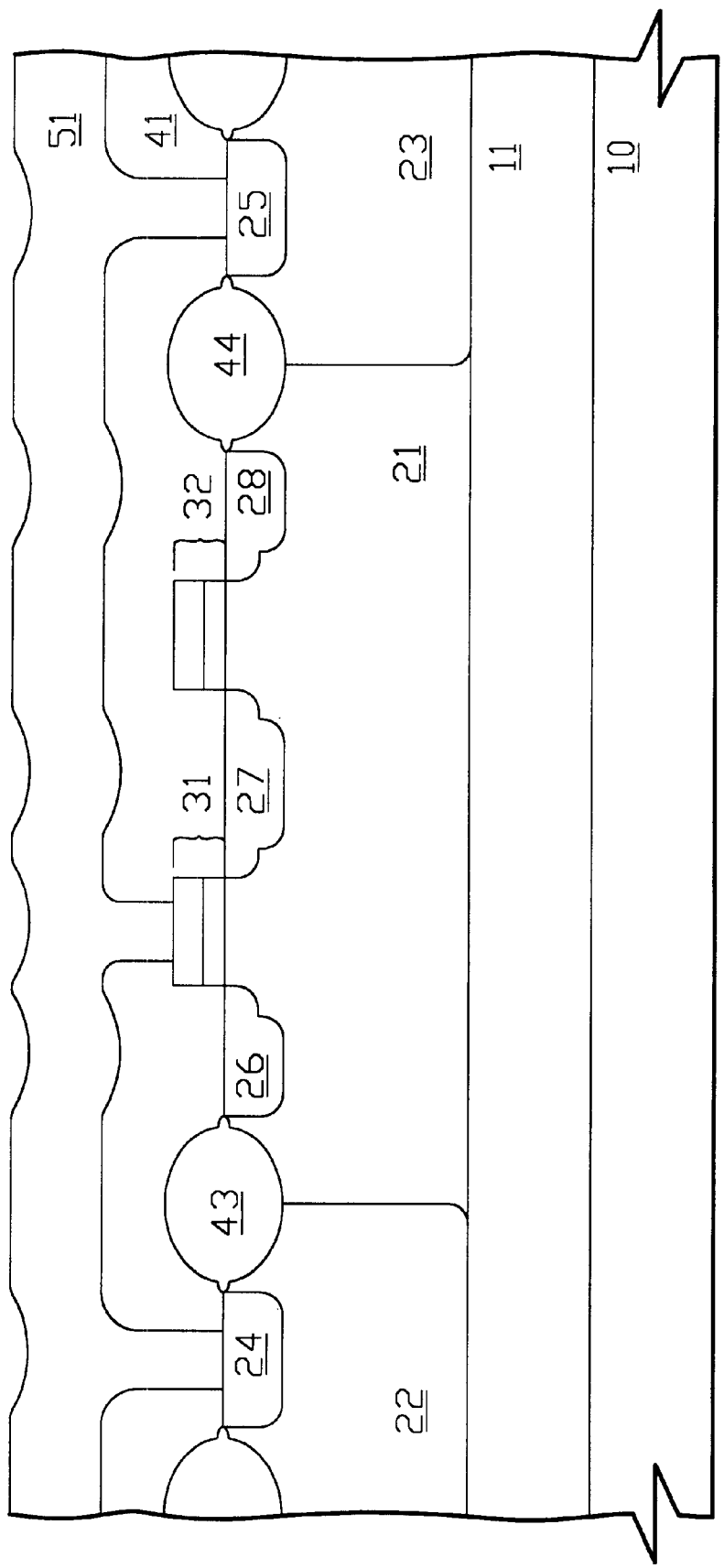

As shown in FIG. 2F, a silicon nitride layer 41 is formed by any suitable methods such as chemical vapor deposition followed by patterning and etching method. The silicon nitride layer 41 covers all the upper surfaces of the first NMOS device, the second NMOS device and the P-epitaxial layer 11 except the portions of the surface of the first gate structure 31, the N-type first diffusion region 24 and the N-type second diffusion region 25. A polysilicon layer 51 is formed by any suitable methods such as chemical vapor deposition. The polysilicon layer 51 is formed on the silicon nitride layer 41 and electrically contacts the N-type first diffusion region 24, the first gate structure 31 and the N-type second diffusion region 25.

Figure 2G:
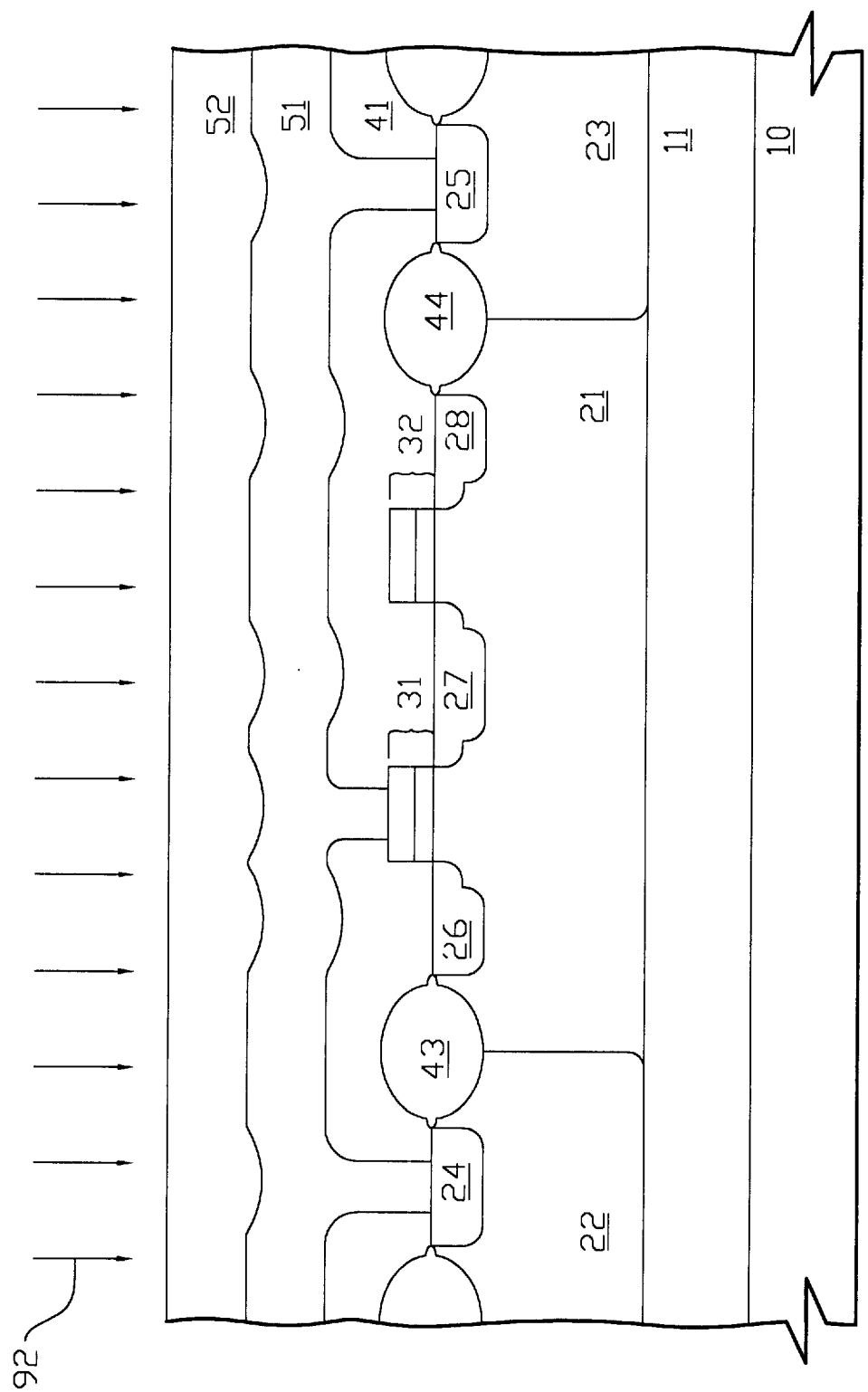

As a key step of this embodiment depicted in FIG. 2G, an amorphous silicon layer 52 acting as a photo-diode area for collecting incident light, is formed by also any suitable methods and on the polysilicon layer 51. An N-type dopants 92 such as Arsenic are blanket ion-implanted in the amorphous silicon layer 52 near the surface of the polysilicon layer 51. And a P-type dopants such as boron fluoride are blanket ion-implanted in the amorphous silicon layer 52 near the upper surface thereof. The amorphous silicon layer 52 is over the first gate structure 31 and the second gate structure 32, which can reduce the area consumption of the pixel.

Figure 2H:
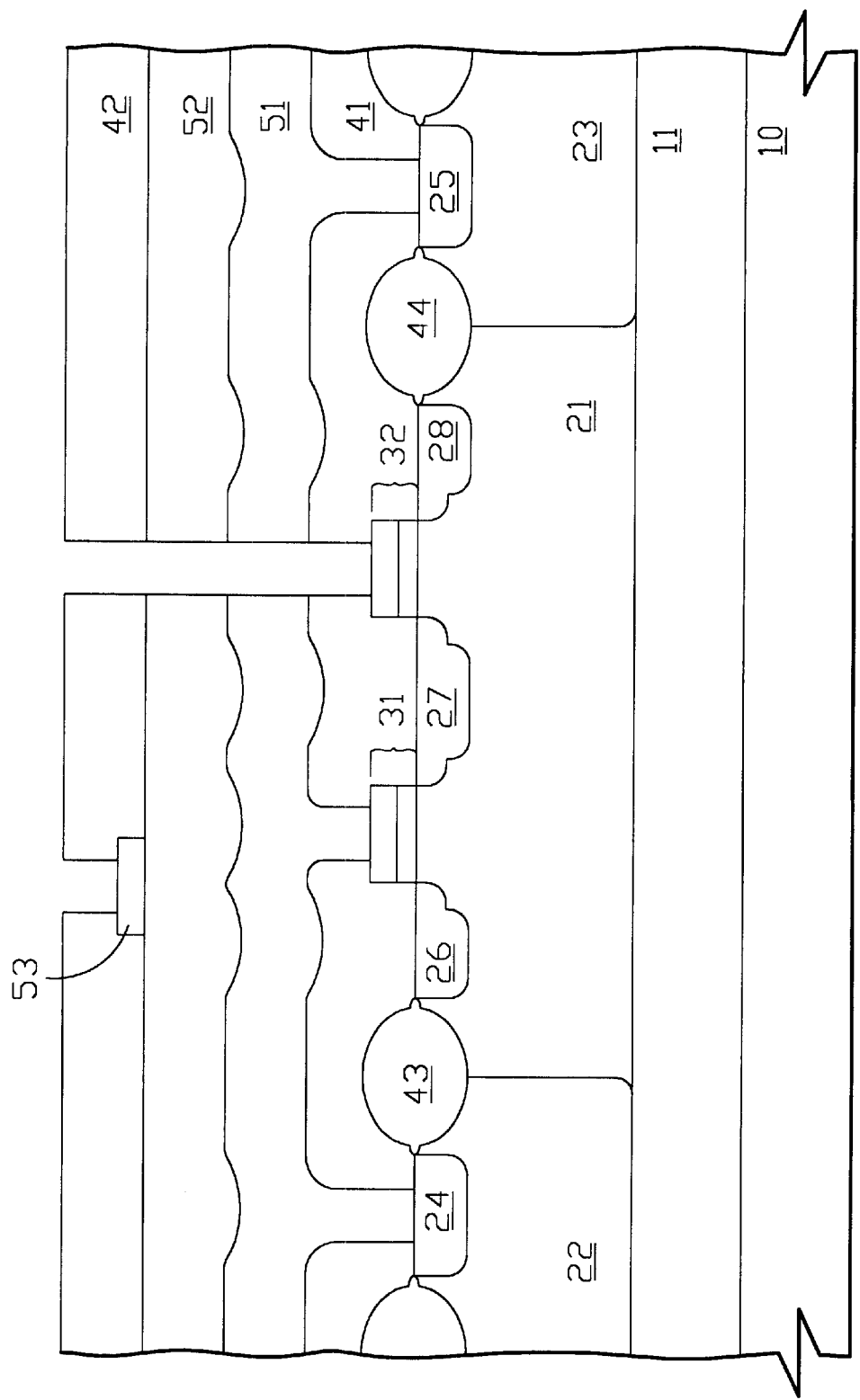

Also as a key step of this embodiment shown in FIG. 2H, a polysilicon layer first is deposited on the amorphous silicon layer 52 by any suitable methods. A electric node 53 comprising the polysilicon layer is formed by any patterning and etching method on the polysilicon layer. Then an oxide layer 42 is deposited on the amorphous silicon layer 52 and the electric node 53. After patterning and etching methods, the electric node 53 and the second gate structure 32 are exposed to outside.

Figure 2I:
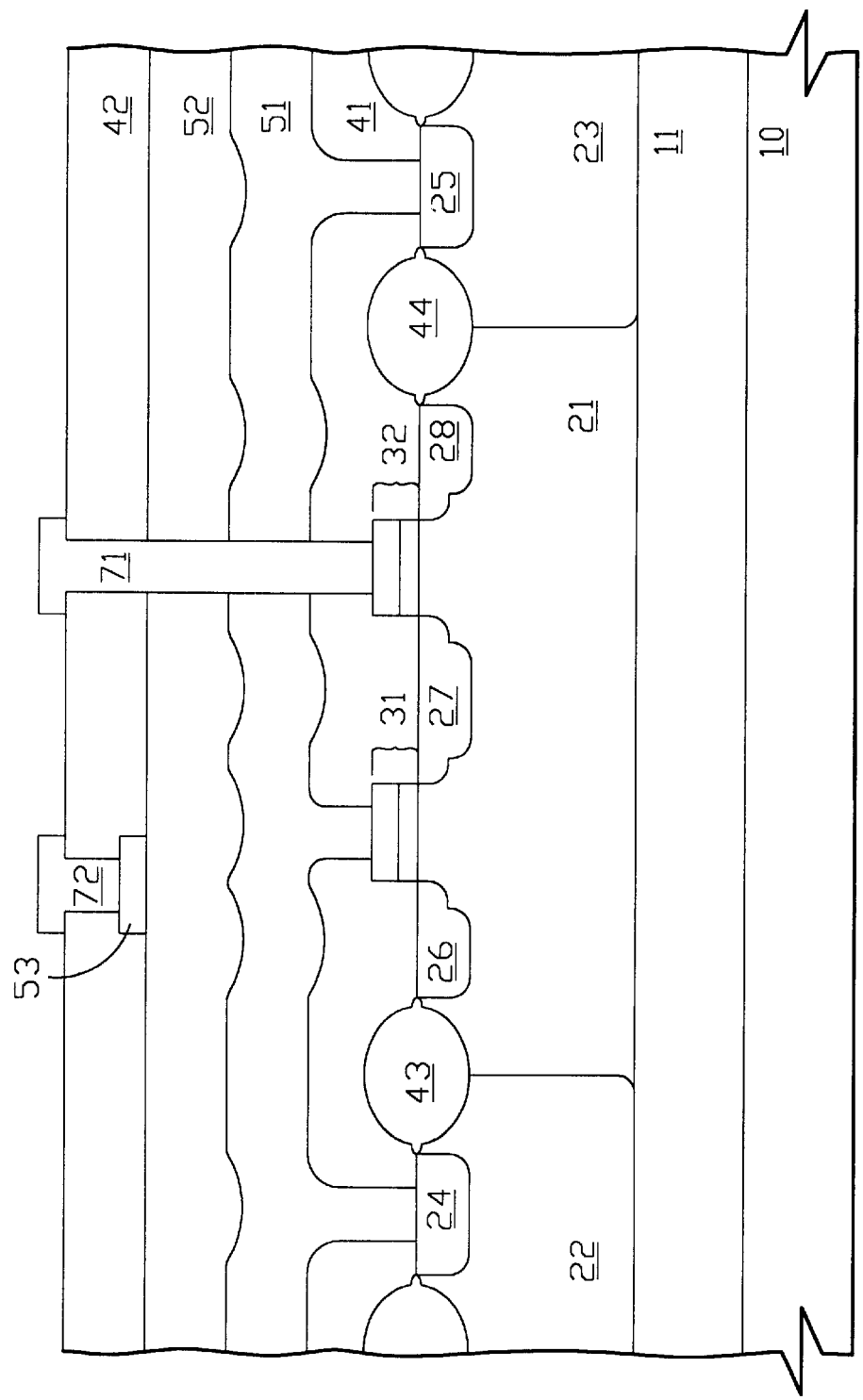

As depicted in FIG. 2I, a via plug structure 72 is formed in a via hole through the oxide layer 42 and electrically connects the electric node 53. Furthermore, the via plug structure 72 connects outside a bias voltage or ground. A contact plug structure 71 is formed in a contact window through the oxide layer 42, the amorphous layer 52, the polysilicon layer 51 and the silicon nitride layer 41. The contact plug structure 71 electrically connects the second gate structure 32.

Figure 3:
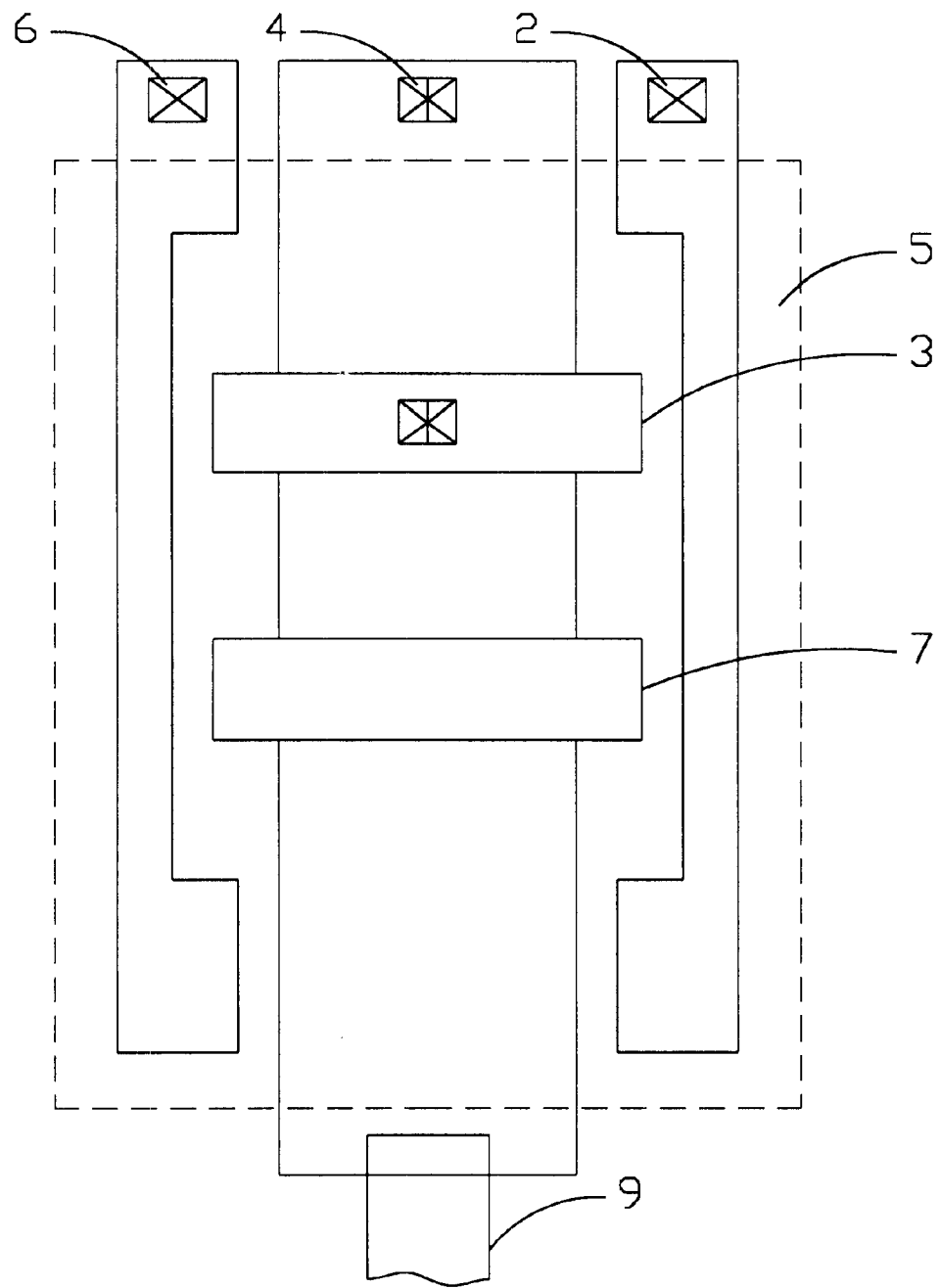
FIG. 3 is a top view showing a layout of a unit pixel of the CMOS image sensor according to the invention.

FIG. 3 is a top view showing a layout of a unit pixel of a CMOS image sensor according to the embodiment of the present invention. As shown in FIG. 3, a dash-line region 5 represents the polysilicon layer and the amorphous silicon layer. A first supply voltage Vdd1 connects a first region 2 and a second region 6. A second supply voltage Vdd2 connects a third region 4. A fourth region 3 represents a source follow and a fifth region 4 represents a row select. A sixth region 9 represents a metal output.

When the preferred embodiment is at operation, the first supply voltage Vdd1 is on and the potential of the photo-diode is promoted to a discharged voltage Vdd. Next, the first supply voltage Vdd1 is floating and the CMOS image sensor is exposed to light. The voltage of the photo-diode is reduced to the value of subtracted delta voltage from Vdd because of the photoelectric effect. Then, the second supply voltage Vdd2 is applied to the row select so that the potential of the row select is high, and the potential value of subtracted delta voltage from Vdd is amplified by the source follower and sampled out. The response steps of the image sensor of the invention are then completed.

The CMOS image sensor of the present invention comprises a photo-diode device and only two transistors built in a vertical structure. The amorphous silicon layer 52, acting as an area collecting incident light, can reduce the size of a CMOS image sensor. Furthermore, when an negative bias voltage is applied to the via plug structure 72, the reverse bias voltage of the photo-diode is much than the voltage Vdd that represents the voltage discharged across the photo-diode during the integration period. Such and operation can add the width of the depletion layer and further add the quantum efficiency. Besides, the another supply voltage Vdd1 electrically connecting the first diffusion region 24 that in the region of the first N-well 22 can prevent a parasitic diode from breaking down.

While the present invention has been described herein in terms of preferred embodiments, numerous modifications and variations will occur to a person the spirit and scope of the present invention. It is intended that the appended claims encompass those modifications and variations.

What is claim is:

1. A method for forming a complementary metaloxide-semiconductor image device, said method comprising:

providing a semiconductor substrate of a first conductivity;

forming a first metal-oxide-semiconductor device which has a first source terminal, a first drain terminal, and a first gate structure in and on said semiconductor substrate;

forming a second metal-oxide-semiconductor device which has a second source terminal, a second drain terminal and a second gate structure in and on said semiconductor substrate, and said second source terminal thereof being adjacent to said first drain terminal of said first metal-oxide-semiconductor device;

forming a first dielectric layer on all the upper surfaces of said first metal-oxide-semiconductor device, said second metal-oxide-semiconductor device and said semiconductor substrate except the portion of the surface of said first gate structure;

forming a polysilicon layer on said first dielectric layer, and electrically contacting said first gate structure of said first metal-oxide-semiconductor device;

forming an amorphous silicon layer on said polysilicon layer for collecting incident light, said amorphous silicon layer over said first metal-oxide-semiconductor device and said metal-oxide-semiconductor device;

blanket ion-implanting dopants of a second conductivity opposite to said first conductivity in said amorphous silicon layer near the surface of said polysilicon layer;

blanket ion-implanting dopants of said first conductivity in said amorphous silicon layer near the upper surface thereof;

forming an electric node on said amorphous silicon layer;

forming a second dielectric layer covering said amorphous silicon layer and said electric node;

forming a via plug structure in a via hole through said second dielectric layer and said via plug structure electrically connecting said electric node; and forming a contact plug structure in a contact window through said second dielectric layer, said amorphous silicon layer, said polysilicon layer and said first dielectric layer and wherein said contact plug structure electrically connecting said second gate structure of said second metal-oxide-semiconductor device.

2. The method according to claim 1, wherein said semiconductor substrate further comprises an epitaxial layer formed thereon.

3. The method according to claim 1, wherein said first metal-oxide-semiconductor device is an N-type metal-oxide-semiconductor device and acts as a source follower of an active pixel.

4. The method according to claim 1, wherein said second metal-oxide-semiconductor device is an N-type metal-oxide-semiconductor device and acts as a row select of the active pixel.

5. The method according to claim 1, wherein said first dielectric layer is silicon nitride and said second dielectric layer is an oxide layer.

6. The method according to claim 1, wherein said first source terminal of said first metal-oxide-semiconductor device is connected to supply voltage.

7. The method according to claim 1, wherein said second drain terminal of said second metal-oxide-semiconductor device is connected to an output device.

8. The method according to claim 1, wherein said first conductivity is P-type and said second conductivity is N-type.

9. The method according to claim 1, wherein said amorphous silicon layer acts as a photo-diode area.

10. The method according to claim 1, wherein said via plug structure is connected to ground or bias voltage.

11. The method according to claim 1, further comprising:

ion-implanting dopants of said second conductivity in said semiconductor substrate to form a first and a second wells, and said all metal-oxide-semiconductor devices between said first well and said second well;

ion-implanting dopants of said second conductivity in said first well to form a first diffusion region in said first well and under the surface of said semiconductor substrate and electrically contact said polysilicon layer; and ion-implanting dopants of said second conductivity in said second well to form a second diffusion region in said second well and under the surface of said semiconductor substrate and electrically contact said polysilicon layer.

12. The method according to claim 11, further comprising:

forming a first isolation device between said first diffusion region and said first source terminal; and forming a second isolation device between said diffusion region and said second drain terminal.

13. A method for forming complementary metal-oxide-semiconductor image device, said method comprising:

providing a semiconductor substrate of a first conductivity, further having an epitaxial layer thereon;

forming a first well of said first conductivity and a second and a third wells of a second conductivity opposite to said first conductivity in said semiconductor substrate, said first well being adjacent to said second well at one side of said first well and said third well at other side of said first well;

forming a first metal-oxide-semiconductor device of said second conductivity which has a first source terminal, a first drain terminal, and a first gate structure in said first well;

forming a second metal-oxide-semiconductor device of said second conductivity which has a second source terminal, a second drain terminal and a second gate structure in said first well, and said second source terminal being adjacent to said first drain terminal of said first metal-oxide-semiconductor device;

ion-implanting dopants of said second conductivity in said second well to form a first diffusion region on the surface of said semiconductor substrate and in said second well;

ion-implanting dopants of said second conductivity in said third well to form a second diffusion region on the surface of said semiconductor substrate and in said third well;

forming a first isolation device contacting said first diffusion region and said first source terminal, and being on the upper surface between said first well and said second well;

forming a second isolation device contacting with said second diffusion region and said second drain terminal, and being on the upper surface between said first well and third well;

forming a first dielectric layer covering all the upper surface of said first metal-oxide-semiconductor device, said second metal-oxide-semiconductor device and said semiconductor substrate except the portions of the surface of said first gate structure, said first diffusion region and said second diffusion region;

forming a polysilicon layer on said first dielectric layer, and contacting said first gate structure, said first diffusion region and said second diffusion region;

forming an amorphous silicon layer on said polysilicon layer for collecting incident light, said amorphous silicon layer over said first metal-oxide-semiconductor device and said metal-oxide-semiconductor device;

blanket ion-implanting dopants of a second conductivity in said amorphous silicon layer near the surface of said polysilicon layer;

blanket ion-implanting dopants of said first conductivity in said amorphous silicon layer near the upper surface thereof;

forming a electric node on said amorphous silicon layer;

forming a second dielectric layer covering said amorphous silicon layer and said electric node;

forming a via plug structure in a via hole through said second dielectric layer and said via plug structure electrically connecting to said electric node; and forming a contact plug structure in a contact window through said second dielectric layer, said amorphous silicon layer, said polysilicon layer and said first dielectric layer and wherein said contact plug structure electrically connecting to said second gate structure of said second metal-oxide-semiconductor device.

14. The method according to claim 13, wherein said first conductivity is P-type and said second conductivity is N-type.

15. The method according to claim 13, wherein all said source and drain terminals further have light doped drain regions adjacent to all said source and drain terminals.

16. The method according to claim 13, wherein all said diffusion regions have heavier dopants than said second and third wells.

17. The method according to claim 13, wherein said first source terminal is connected to supply voltage and said first diffusion region is connected to other supply voltage.

18. The method according to claim 13, wherein said second drain terminal is connected to an output device.

19. The method according to claim 13, wherein said amorphous silicon layer comprises of amorphous silicon, and is doped with ion of said first conductivity consisting of boron fluoride and ion of said second conductivity consisting of arsenic.

20. The method according to claim 13, wherein said first contact is connected to ground or bias voltage.

21. A method for forming a complementary metal-oxide-semiconductor image device, said method comprising:

providing a semiconductor substrate of a first conductivity;

forming a first metal-oxide-semiconductor device which has a first source terminal, a first drain terminal and a first gate structure in and on semiconductor substrate;

forming a second metal-oxide-semiconductor device which has a second source terminal, a second drain terminal and a second gate structure in and on said semiconductor substrate, and said second source terminal thereof being adjacent to said first drain terminal of said first metal-oxide-semiconductor device;

forming a first dielectric layer on all the upper surfaces of said first metal-oxide-semiconductor semiconductor device, said second metal-oxide-semiconductor device and said semiconductor substrate except the portion of the surface of said first gate structure;

forming a polysilicon layer on said first dielectric layer, and electrically contacting said first gate structure of said first metal-oxide-semiconductor device;

forming an amorphous silicon layer on said polysilicon layer;

ion-implanting dopants of a second conductivity opposite to said first conductivity in said amorphous silicon layer near the surface of said polysilicon layer;

ion-implanting dopants of said first conductivity in said amorphous silicon layer near the upper surface thereof;

forming an electric node on said amorphous silicon layer;

forming a second dielectric layer coverhig said amorphous silicon layer and said electric node;

forming a via plug structure in a via hole through said second dielectric layer and said via plug structure electrically connecting said electric node, said via plug structure connected to a bias voltage; and forming a contact plug structure in a contact window through said second dielectric layer, said amorphous silicon layer, said polysilicon layer and said first dielectric layer and wherein said contact plug structure electrically connecting said second gate structure of said second metal-oxide-semiconductor device.

22. The method according to claim 21, wherein said first source terminal of said first metal-oxide-semiconductor device is connected to supply voltage.

23. A method for forming complementary metal-oxide-semiconductor image device, said method comprising:

providing a semiconductor substrate of a first conductivity, further having an edit axial layer thereon;

forming a first well of said first conductivity and a second and a third wells of a second conductivity opposite to said first conductivity in said semiconductor substrate, said first well being adjacent to said second well at one side of said first well and said third well at other side of said first well;

forming a first metal-oxide-semiconductor device of said second conductivity which has a first source terminal connected to a supply voltage, a first drain terminal, and a first gate structure in said first well;

forming a second metal-oxide-semiconductor device of said second conductivity which has a second source terminal, a second drain terminal and a second gate Structure in said first well, and said second source terminal being adjacent to said first drain terminal of said first metal-oxide-semiconductor device;

ion-implanting dopants of said second conductivity in said second well to form a first diffusion region on the surface of said semiconductor substrate and in said second well;

ion-implanting dopants of said second conductivity in said third well to form a second diffusion region on the surface of said semiconductor substrate and in said third well;

forming a first isolation device contacting said first diffusion region and said first source terminal, and being on the upper surface between said first well and said second well;

forming a second isolation device contacting with said second diffusion region and said second drain terminal and being on the upper surface between said first well and third well;

forming a first dielectric layer covering all the upper surface of said first metal-oxide-semiconductor device, said second metal-oxide-semiconductor device and said semiconductor substrate except the portions of the surface of said first gate structure, said first diffusion region and said second diffusion region;

forming a polysilicon layer on said first dielectric layer, and contacting said first gate structure, said first diffusion region and said second diffusion region;

forming an amorphous silicon layer on said polysilicon layer;

ion-implanting dopants of a second conductivity in said amorphous silicon layer near the surface of said polysilicon layer;

ion-implanting dopants of said first conductivity in said amorphous silicon layer near the upper surface thereof;

forming an electric node on said amorphous silicon layer;

forming a second dielectric layer covering said amorphous silicon layer and said electric node;

forming a via plug structure in a via hole through said second dielectric layer and said via plug structure electrically connecting to said electric node; and forming a contact plug structure in a contact window through said second dielectric layer, said amorphous silicon layer, said polysilicon layer and said first dielectric layer and wherein said contact plug structure electrically connecting to said second gate structure of said second metal-oxide-semiconductor device.

24. The method according to claim 23, wherein said first diffusion region is connected to other supply voltage.

25. The method according to claim 23, wherein said second drain terminal is connected to an output device.

26. The method according to claim 23, wherein said amorphous silicon layer comprises of amorphous silicon, and is doped with ion of said first conductivity consisting of boron fluoride and ion of said second conductivity consisting of arsenic.

* * * * *